United States Patent
Andoh et al.

(10) Patent No.: US 10,039,189 B2
(45) Date of Patent: Jul. 31, 2018

(54) CIRCUIT FIXING MEMBER, CIRCUIT MODULE, AND JOINING METHOD FOR CIRCUIT MODULE

(71) Applicant: DENSO CORPORATION, Kariya, Aichi-pref. (JP)

(72) Inventors: Kouji Andoh, Motosu (JP); Yu Murata, Obu (JP); Yasuo Kakumae, Anjo (JP)

(73) Assignee: DENSO CORPORATION, Kariya (JP)

( * ) Notice: Subject to any disclaimer, the term of this patent is extended or adjusted under 35 U.S.C. 154(b) by 343 days.

(21) Appl. No.: 14/773,539

(22) PCT Filed: Mar. 7, 2014

(86) PCT No.: PCT/JP2014/056048
§ 371 (c)(1),
(2) Date: Sep. 8, 2015

(87) PCT Pub. No.: WO2014/136964
PCT Pub. Date: Sep. 12, 2014

(65) Prior Publication Data
US 2016/0021751 A1    Jan. 21, 2016

(30) Foreign Application Priority Data

Mar. 8, 2013    (JP) ................. 2013-046165

(51) Int. Cl.
*H05K 1/18* (2006.01)
*H01R 13/66* (2006.01)
(Continued)

(52) U.S. Cl.
CPC ........... *H05K 1/18* (2013.01); *H01R 13/4361* (2013.01); *H01R 13/6658* (2013.01);
(Continued)

(58) Field of Classification Search
CPC .. H05K 1/18; H01R 13/6658; H01R 13/4361; H01R 13/5216; G01D 11/24
See application file for complete search history.

(56) References Cited

U.S. PATENT DOCUMENTS

| 7,722,362 | B2 * | 5/2010 | Frake ............ B29C 43/18 |
| | | | 439/76.1 |
| 2007/0049121 | A1 | 3/2007 | Steele |
| 2008/0026610 | A1 | 1/2008 | Frake et al. |

FOREIGN PATENT DOCUMENTS

| JP | 10-335003 | 12/1998 |
| JP | 2003-223950 | 8/2003 |

(Continued)

OTHER PUBLICATIONS

Office Action (3 pgs.) dated Nov. 10, 2015 issued in corresponding Japanese Application No. 2013-046165 with an at least partial English language translation (4 pgs.).
(Continued)

*Primary Examiner* — Nathan Milakovich
(74) *Attorney, Agent, or Firm* — Nixon & Vanderhye PC

(57) ABSTRACT

A circuit fixing member is provided which achieves a connection with a controlled object after a circuit module is produced, thereby avoiding disconnection of a wire member in the course of the production, easy to transfer between production processes, and is designed to avoid the entry of water into the circuit module. The terminal-embedded portion 110 of the circuit fixing member 10 which retains the control circuit 15 is equipped with a plurality of circuit supports 111 and the space 115 which communicates at an end thereof with the opened terminal insertion hole 117 and is closed at the other end thereof. For engaging the terminal fitting portion 130 of the terminal member 13 with the fitting portion 200 of the controlled object side terminal member 20 within the space 115, the terminal locking opening 114 and the terminal locking member 14 are provided. The terminal locking member 14 works to secure the locked portion 201 in the space 115.

6 Claims, 10 Drawing Sheets

(51) Int. Cl.
    *H01R 13/436*  (2006.01)
    *H01R 13/52*   (2006.01)
    *G01D 11/24*   (2006.01)

(52) U.S. Cl.
    CPC .......... *G01D 11/24* (2013.01); *H01R 13/5216* (2013.01); *H05K 2201/10189* (2013.01)

(56) References Cited

FOREIGN PATENT DOCUMENTS

| | | |
|---|---|---|
| JP | 2007-093508 | 4/2007 |
| JP | 2009-506555 | 2/2009 |
| JP | 2009-54506  | 3/2009 |
| JP | 2010-530541 | 9/2010 |

OTHER PUBLICATIONS

International Preliminary Report on Patentability (6 pages) dated Sep. 17, 2015, issued in corresponding Application No. PCT/JP2014/056048 and English translation (10 pages).
International Search Report for PCT/JP2014/056048, dated Jun. 10, 2014, 6 pages.
Written Opinion of the ISA for PCT/JP2014/056048, dated Jun. 10, 2014, 12 pages.

\* cited by examiner

SENSOR/LOAD SIDE

POWER SUPPLY/ECU SIDE

SENSOR/LOAD SIDE

POWER SUPPLY/ECU SIDE

CIRCUIT FIXING MEMBER, CIRCUIT MODULE, AND JOINING METHOD FOR CIRCUIT MODULE

This application is the U.S. national phase of International Application No. PCT/JP2014/056048 filed 7 Mar. 2014, which designated the U.S. and claims priority to JP Patent Application No. 2013-046165 filed 8 Mar. 2013, the entire contents of each of which are hereby incorporated by reference.

TECHNICAL FIELD

The present invention generally relates to a circuit fixing member which has a built in terminal member to connect a control circuit working to control a controlled object such as an external sensor or a load with the controlled object and which supports and fixes a circuit, a circuit module equipped with such a circuit fixing member, and a joining method for the circuit module.

BACKGROUND ART

Usually, detecting portions of temperature sensors or gas sensors used in vehicles or output portions of injectors or glow plugs are disposed in extreme environments where they are exposed to high-temperature atmosphere or strong vibration, while a control circuit for such detecting portions or output portions is located in relatively stable environments. The detecting portions and the output portions are connected to the control circuit through conductors such as lead wire or wire harnesses.

For example, Patent Literature 1 discloses a sensor adapter circuit housing assembly which includes a circuit board, a body, a cavity, a housing, an input line, a single structure, and a connector. The circuit board is designed to receive a sensor signal and produce a sensor characteristic as a function of the received sensor signal. The cavity is defined by an inner surface of the body and shaped to store the circuit board therein. The housing is featured to have the circuit board disposed inside the cavity. The input line is engineered to receive the sensor signal from the sensor. The single structure has a first end directly coupled with an end of the input line and a second end disposed in the cavity. The connector is joined directly to the circuit board to make a first electric connection with the circuit board.

The connector is, as taught in Patent Literature 1, arranged at the end of the input line which achieves the connection with the sensor, disposed within a mold with a given cavity, and then insert-molded or transfer-molded to integrally form the housing.

Generally, the control circuit is covered with resin such as epoxy resin to ensure the airtightness and disposed in the housing made from thermoplastic resin such as PPS.

Particularly, when the detecting portion or the output portion is exposed to a high-temperature environment, the conductor is used which is covered with a heat-resisting insulating film such as fluorine resin or silicone resin.

PATENT LITERATURE 1

Japanese translation of PCT International Application Publication 2010-530541

SUMMARY OF THE INVENTION

Problem to be Solved by the Invention

However, when the connector is disposed at the end of the conductor coupled with the sensor and unified with the housing by means of the resin-molding, it will result in a lack of adhesion between the heat-resisting insulating film used to coat the conductor and the thermoplastic resin used as the housing, thus encountering a difficulty in avoiding entry of water into the housing from outside completely.

The connector which is joined to the long conductor needs to be disposed in the mold to form the housing and then moved in the following processes, thus resulting in a difficulty in handling material or the product, which will lead to an increase in size of the device.

Further, the conductor is sandwiched between molds when the housing is formed. It is, thus, desirable to create a large clearance between the conductor and the molds in order to avoid the breakage of the conductor, while it is preferable to decrease the clearance between the conductor and the molds in order to avoid the leakage of resin to improve the appearance of the product. It is, thus, necessary to take action to overcome the trade-off.

It is, however, necessary to join the sensor or actuator in advance to the connector that is the controlled object depending upon the structure thereof. If any defect occurs in the course of production of the circuit module, the circuit module will be an inferior product along with the connector. Even if such a defect is very small, it will cause serious damage.

Further, it may be difficult to apply the method of joining a controlled object and a control portion through a connector which is now widely used with in-vehicle sensors to products in small quantities because vehicle manufacturers usually use different types of connectors, respectively.

Additionally, in-vehicle gas sensors or temperature sensors usually need high accuracy of measurement, thus requiring regulating every pair of the controlled object and the control portion. In such a case, it is advisable that the controlled object and the control portion be designed so that it is difficult for them to be detached from each other once being joined together. The joining method for the circuit module is needed as an alternative to the joining method using the conventional connector.

In view of the above fact, the present invention relates to a circuit fixing member which has built in a terminal member to connect a control circuit working to control a controlled object such as an external sensor or a load with the controlled object and which supports and fixes the control circuit, a circuit module equipped with such a circuit fixing member, and a joining method for the circuit module. The present invention provides the circuit fixing member which is engineered to join a conductor thereto for achieving a joint with the controlled object after the circuit module is produced, thereby avoiding disconnection of the conductor in the course of the production of the circuit module, is easy to transfer between manufacturing processes, avoids an increase in size of a device for transferring between the manufacturing processes, like in the conventional structure, ensures blocking of entry of water into the circuit module, and makes it impossible to disconnect the control circuit and the controlled object from each other once joined together.

Means for Solving the Problem

An example embodiment of the invention (10, 10a, 10b, 10c, 10d) provides a circuit fixing member which has built in a terminal member (13) which achieves a connection between a control circuit (15) which works to control an external controlled object (3) and the controlled object (3), and which secures the control circuit (15). The circuit fixing member includes a terminal-embedded portion (110) in which at least the terminal member (13) is embedded. The terminal-embedded portion (110) is equipped with a plurality of circuit supports (111) which protrude from one or both surfaces of the terminal-embedded portion (110) and a terminal conducting space (115) which communicates at one end thereof with a terminal insertion hole (117) opening to a side surface of the terminal-embedded portion and is closed at the other end thereof. The terminal member (13) is equipped with a terminal fitting portion (130) for connecting with said controlled object (3) and a circuit side connecting portion (131) for connecting with said control circuit (15). For engaging the controlled object side terminal member (20, 20b) which has already been joined to the controlled object (3) with said terminal fitting portion (130) within said terminal conducting space (115), a terminal locking opening (114, 114a, 114b, and 114d) is provided which establishes communication between either or both upper and lower surfaces of said terminal-embedded portion (110) and said terminal conducting space (115), and a terminal locking member (14, 14a, 14b, 14d) is provided which locks said controlled object side terminal member (20, 20b) inside said terminal conducting space (115) through the terminal locking opening (114, 114a, 114b, 114d).

The circuit fixing member (10, 10c) of another example embodiment of the invention is such that the terminal locking member (14) includes an opening end cover (140) which closes an open end of said terminal locking opening (114), an elastically deformable terminal locking mechanism (141) which extends from the opening end cover (140) in the form of a tongue and is placed in contact with a terminal locked portion (201) of said controlled object side terminal member (20).

The circuit fixing member (10a) of another example embodiment of the invention is such that said terminal locking member (14a) includes an opening end cover (140a) and a terminal locking mechanism (141a). The opening end cover closes an open end of said terminal locking opening (114a) formed in the surface of said terminal-embedded portion (110a) on which said circuit supports (11qa) are not provided. The terminal locking mechanism (141a) extends from the opening end cover (140a) to make a contact with a terminal locking portion (201) of the controlled object side terminal member (20).

The circuit fixing member (10b, 10d) of another example embodiment of the invention is such that said terminal locking member (14b, 14d) includes an opening end cover (140b, 140d) which closes an open end of said terminal locking opening (114b, 114d). The controlled object side terminal member (20b, 20d) includes a terminal locked portion (201b, 201d) which extends in the form of a tongue to make contact with an edge of said terminal locking opening (114b, 114d).

The circuit fixing member (10a) of another example embodiment of the invention is such that said control circuit (15) connects with a plurality of the controlled objects (3). Locations where said terminal locking member (14a) contacts with said controlled object side terminal members (20) are changed for the respective controlled objects (3).

Another example embodiment of the invention is a circuit module (1, 1a, 1b, 1c, 1d) comprising a circuit fixing member and a control circuit (15). The circuit fixing member has built in at least a terminal member (13) which achieves a connection between the control circuit (15) working to control a controlled object (3), as provided externally, and the controlled object (3) and which secures said control circuit (15). The control circuit (15) is hermetically sealed with a sealing member (16) integrally. The circuit fixing member is the circuit fixing member (10, 10a, 10b, 10c, 10d).

Another example embodiment of the invention is a method of joining a circuit module (1, 1b, 1c, 1d) and a controlled object (3). The circuit module includes a circuit fixing member and a control circuit (15). The circuit fixing member has built in at least a terminal member (13) which achieves a connection between the control circuit (15) working to control the controlled object (3), as provided externally, and the controlled object (3) and which secures said control circuit (15). The circuit module air-tightly seals the control circuit (15) with a sealing member (16) integrally. The circuit module (1, 1b, 1c, 1d) includes the circuit fixing member (10, 10b, 10c, 10d). The controlled object side terminal member (20, 20b, 20d) includes a controlled object side fitting portion (200), the terminal locked portion (201, 201b, 201d), and a water-resistant seal (21). The controlled object side fitting portion is to be fitted to the terminal fitting portion (130). The water-resistant seal is to be placed elastically in close contact with said terminal insertion hole (117). After the control circuit (15) is mounted on said circuit fixing member (10, 10b, 10c, 10d), coupled with said terminal member (13), and the control circuit (15) is air-tightly covered with the sealing member (16) to complete said circuit module (1, 1b, 1c, 1d), said controlled object side terminal member (20, 20b, 20d) is inserted into said terminal insertion hole (117) to make a connection between said terminal fitting portion (130) and said controlled object side fitting portion (200).

Another example embodiment of the invention is a method of joining a circuit module (1, 1b, 1c, 1d) and a controlled object (3). The circuit module includes a circuit fixing member and a control circuit (15). The circuit fixing member has built in at least a terminal member (13) which achieves a connection between the control circuit (15) working to control the controlled object (3), as provided externally, and the controlled object (3) and which secures said control circuit (15). The circuit module air-tightly seals the control circuit (15) with a sealing member (16) integrally. The circuit module (1a) includes the circuit fixing member (10a). The controlled object side terminal member (20) includes a controlled object side fitting portion (200), said terminal locked portion (201), and a water-resistant seal (21). The controlled object side fitting portion is to be fitted to said terminal fitting portion (130a). The water-resistant seal is to be placed elastically in close contact with said terminal insertion hole (117). After said control circuit (15) is mounted on said circuit fixing member (10a), coupled with said terminal member (13), and the control circuit (15) is air-tightly covered with the sealing member (16) to complete said circuit module (1a) without installing said locking member (14a) on said circuit fixing member (10a), said connected object side terminal member (20) is inserted into said terminal insertion hole (117a) to make a connection between said terminal fitting portion (130) and said controlled object side fitting portion (200), after which said locking member (14a) is installed to lock said controlled object side terminal fitting portion (200).

Effects of the Invention

According to this invention, after said circuit module (1, 1a, 1b, 1c, 1d) is produced, the conductor (22) which achieves a connection with the controlled object (3) is joined thereto, thereby avoiding a disconnection of the conductor (22) completely during the production of the circuit module (1, 1a, 1b, 1c, 1d).

It is unnecessary to connect the conductor (22) to the terminal member (13) in advance, thus facilitating the ease with which the circuit module (1, 1a, 1b, 1c, 1d) is transferred between the production processes, which may avoid an increase in size of a device for use in moving the circuit module, like in the prior art, along with the conductor.

Further, the installation of the water-resistant seal (21) made of elastic material on the controlled object side terminal member (20) enables the controlled object side terminal member to be placed in close contact with the terminal insertion hole (117) easily, thereby avoiding the entry of water into the circuit module.

Additionally, in the case of use in a vehicle, it is possible to achieve a connection with a mating part without any connector. It is easy to realize low-volume production.

EMBODIMENTS

Figure 1A:
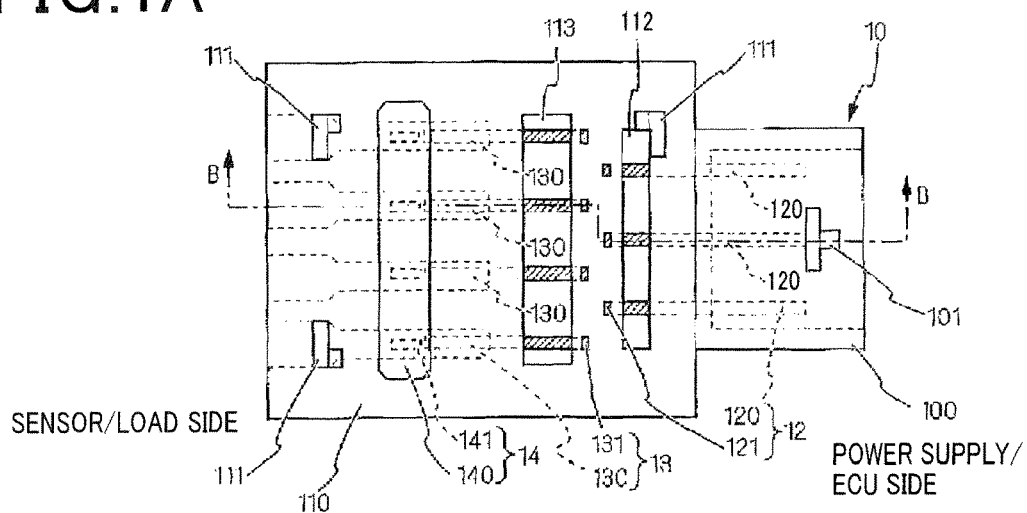
FIG. 1A is a plane view which illustrates an outline of a circuit fixing member in the first embodiment of the invention.

This embodiment relates to a circuit fixing member 10 (which will be referred to below as a fixing member 10) which is equipped with a circuit support 111 (which will be referred to below as a support 111) serving to support and secure a control circuit 15 (which will be referred to below as a circuit 15) working to control operations of a controlled object 3 such as a sensor, for example, an external temperature sensor or a gas sensor, a motor, a solenoid, a piezoelectric actuator, or another load, and also works to hold a terminal member 12 for connecting the controlled object 3 and the circuit 15 together.

For facilitating a better understanding of embodiments, the following discussion will refer to an example wherein a temperature sensor which is installed in an exhaust passage of an internal combustion engine or an engine block to measure the temperature of combusted exhaust gas or engine coolant is the controlled object 3.

Figure 1B:
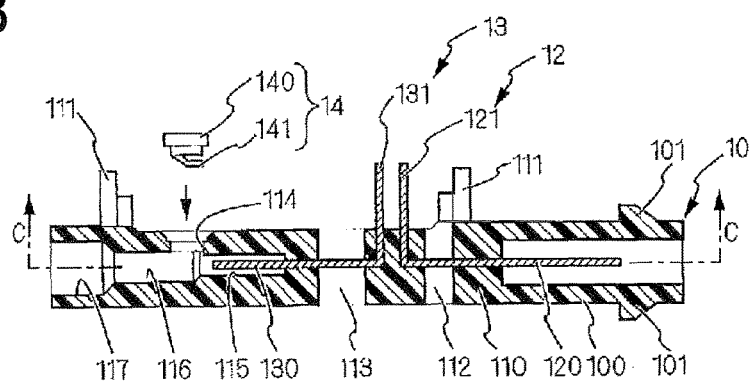
FIG. 1B is a sectional view along B-B in FIG. 1A.
Figure 1C:
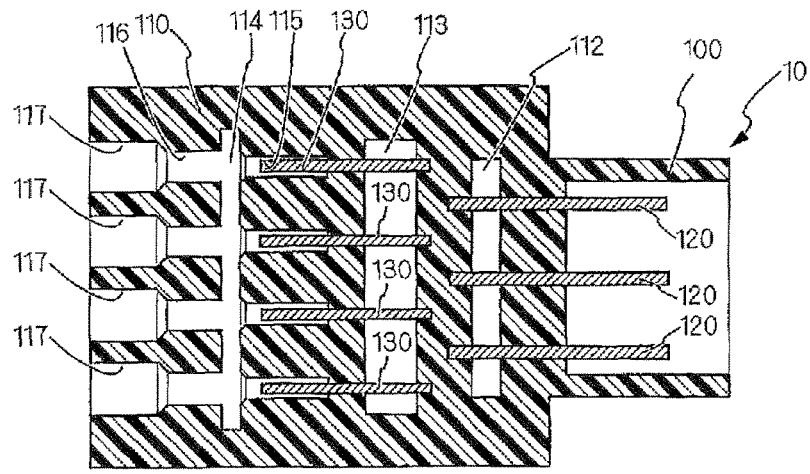
FIG. 1C is a sectional view along C-C in FIG. 1B.

The fixing member 10 in the first embodiment of the invention will be described below with reference to FIGS. 1A, 1B, and 1C.

The fixing member 10 is made of a known thermoplastic resin such as PPS in the shape of a planar plate and is equipped with a terminal-embedded portion 110 which has at least terminal members 13 are embedded therein.

This embodiment refers to the example where the four terminal members 13 are embedded, but the number of the terminal members 13 may be changed depending upon a circuit to be used.

The terminal-embedded portion 110 of this embodiment has also embedded therein terminal members 12 for connection with a not shown power supply or another electronic control unit (ECU).

The terminal-embedded portion 110 of this embodiment has supports 111 formed on three places of either one of upper and lower surfaces thereof.

The supports 111 are shaped stepwise to form a step for supporting the corner of the circuit 15, which will be described later, at bottom and side surfaces thereof. The shape, the location, or the number of the supports 111 is not limited as long as it can stably support and fix the circuit 15.

This embodiment refers to the example where the circuit 15 is disposed on one of surfaces of the terminal-embedded portion 110, however, the supports 111 may be formed on both the surfaces of the terminal-embedded portion 110 to support circuits 15 hierarchically.

The terminal-embedded portion 110 has formed therein terminal conducting spaces 115 (which will be referred to below as spaces 115) each of which communicates at one of ends thereof with the terminal insertion hole 117 (which will be referred to as an insertion hole 117) opening to the side surface of the terminal-embedded portion 110 and has the other end closed.

The terminal member 13 includes a terminal fitting portion 130 (which will be referred to below as a fitting portion 130) for connecting with the controlled object 3 and a circuit side connecting portion 131 (which will be referred to below as a connecting portion 131) for connecting with the circuit 15.

The fitting portion 130 is exposed to the space 115.

The connecting portion 131 extends vertically to the surface on which the supports 111 are formed and is connectable with the circuit 15.

The fitting portion 130 is fit in the controlled object side terminal member 20 (which will be referred to below as a terminal member 20) which is joined in advance to the connected portion 3 within the space 115.

In this embodiment, a terminal fitting opening 114 (which will be referred to below as an opening 114) is drilled which communicates between the surface on which the supports 111 of the terminal-embedded portion 110 are formed and the spaces 115.

A terminal locking member 14 (which will be referred to below as a locking member 14) is disposed in the opening 114 to secure the terminals 20 in the spaces 115.

The locking member 14 of this embodiment includes an opening end cover 140 and terminal locking mechanisms 141 (which will be referred to below as tongues 141). The opening end cover 140 closes an open end of the opening 114. The tongues 141 extend from the opening end cover 140 in the shape of a tongue and contact terminal locked portions 201 (which will be referred to below as locked portions 201) of the terminal members 20.

The locking member 14 is made from the thermoplastic resin as that of the fixing member 10. The tongues 141 have flexibility so that they are elastically deformable.

In this embodiment, a substantially cylindrical connector housing 100 is formed which extends from the terminal-embedded portion 110. The connector housing 100 has formed thereon a claw portion 101 which engages a mating part.

The terminal members 12 have terminal fitting portions 120 which are to be fit on mating parts and exposed inside the connector housing 100. Terminal circuit side connecting portions 121 are exposed from the surface of the terminal-embedded portion 110 on which the supports 111 are formed.

The fixing member 10 of this embodiment is formed through so-called insert-molding by placing the terminal members 12 and 13 in a mold (not shown) with a cavity contoured to conform with the shape of the fixing member 10 and filling the cavity with thermoplastic resin (TPR).

The terminal members 12 and 13 are, therefore, retained in place within the mold, so that through holes 112 and 113 are formed which pass through a thickness of the terminal-embedded portion 110.

In the insert-molding, the terminal members 12 and 13 may be joined by tie bars in order to facilitate the ease with which the terminal members 12 and 13 are set in the mold. The tie bars may be removed by the tie-bar cutting.

The circuit module 1 and how to connect the circuit module 1 with the sensors 3 using the fixing member 10 of this embodiment will be described below with reference to FIGS. 2A, 2B, 2C, 3A, 3B, and 4.

Figure 2A:
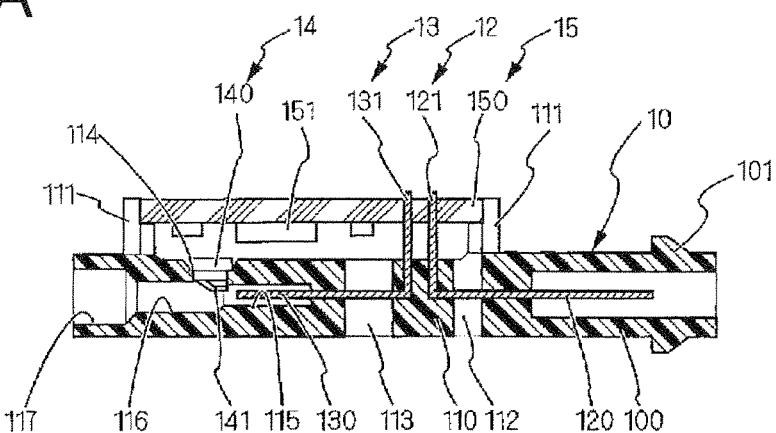
FIG. 2A is a sectional view which illustrates a control circuit mounted on a circuit fixing member.

The pre-formed circuit 15 is, as illustrated in FIG. 2A, fit on the supports 111 of the fixing member 10.

The circuit 15 has circuit parts 151 such as passive components, for example, resistors, capacitors, or inductors and active components, for example, MOSFETs, IGBTs, diodes, or integrated circuits mounted on a known circuit board 150 such as a printed circuit board or an alumina substrate.

When the circuit 15 is retained on the supports 111, the connecting portions 121 and 131 are inserted into through holes drilled in the circuit board 150 and soldered as needed to achieve electric conduction with the circuit 15.

Next, the locking member 14 which is pre-formed by resin is fit in the opening 114 formed in the fixing member 10.

Figure 2B:
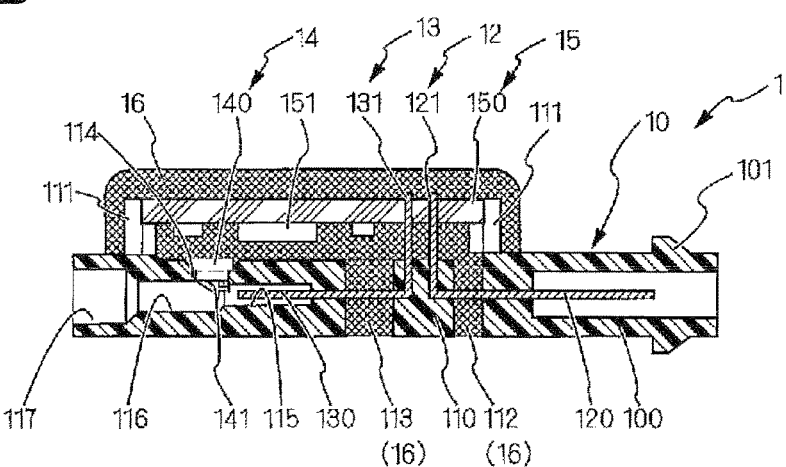
FIG. 2B is a sectional view which illustrates an outline of a circuit module in which a control circuit is covered with a sealing member in the first embodiment.
Figure 2C:
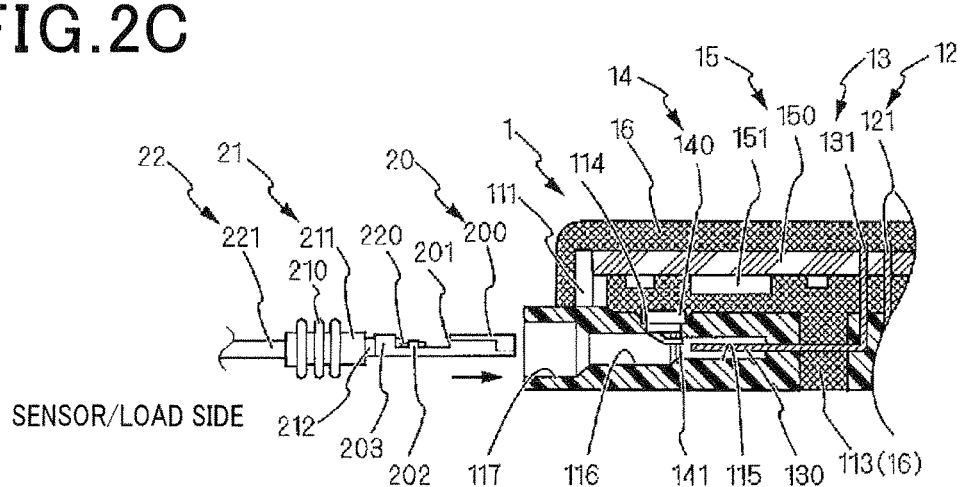
FIG. 2C is a sectional view which illustrates how to join a circuit module with a wiring terminal connected to a sensor in the first embodiment.

The circuit 15 is fixed in a mold with a cavity which covers the circuit 15. The cavity is then filled with known thermoplastic resin such as epoxy to seal the circuit 15, thereby molding sealing members 16. Simultaneously, the through holes 112 and 113 are sealed. The locking member 14 is also fixed. This causes, as illustrated in FIG. 2B, the top ends of the tongues 141 to be exposed and located at edges of the spaces 115.

The conductors 22 extending outside the controlled objects 3 have conductive wire 220 disposed on the center thereof and an insulating film 221 covering the periphery of the conductive wire 220.

The insulating films 221 are made from known flexible insulating coating material such as fluorine resin, silicone resin, vinyl chloride, or polyethylene resin. The conductive wires 220 are made from known conductor material such as copper, aluminum, nickel, iron, or stainless depending on the intended use.

The conductive wires 220 each have a water-resistant seal 21 and a terminal 20 formed on an end thereof.

The water-resistant seal 21 is made of an elastic material such as fluoro-rubber, silicone rubber, or NBR and includes a cylindrical conductor holder 211 and substantially annular seal rings 210. The conductor holder 211 covers the insulating film 221.

The conductor holder 211 and the seal rings 210 may be formed integrally with each other or separately from each other.

The metallic terminal members 20 are press-fit on the tips of the seals 21.

The terminal member 20 is made up of a substantially cylindrical controlled object-side fitting portion 200, a locked portion 201 that is a major part of the invention and with which the tip of the tongue 141 contacts, so that it is locked, a conductor gripper 202 which is to connect with the conductive wire 220, and a seal gripper 203 which holds the tip 212 of the seal 21.

Seal fitting portions 116 are formed between the through holes 117 and the spaces 115, respectively.

Figure 3A:
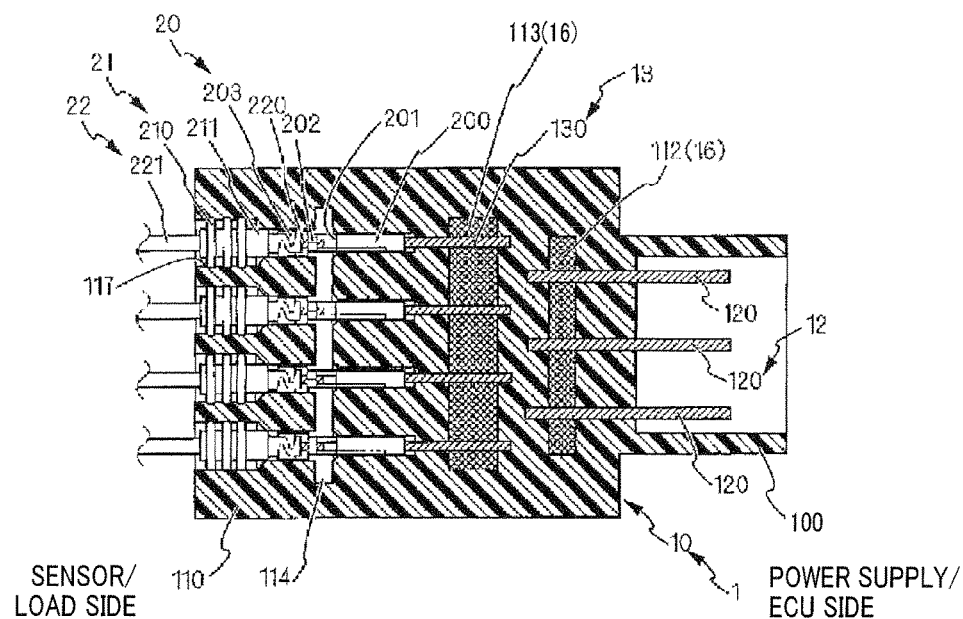
FIG. 3A is a sectional view corresponding to FIG. 1C when a wiring terminal is joined.
Figure 3B:
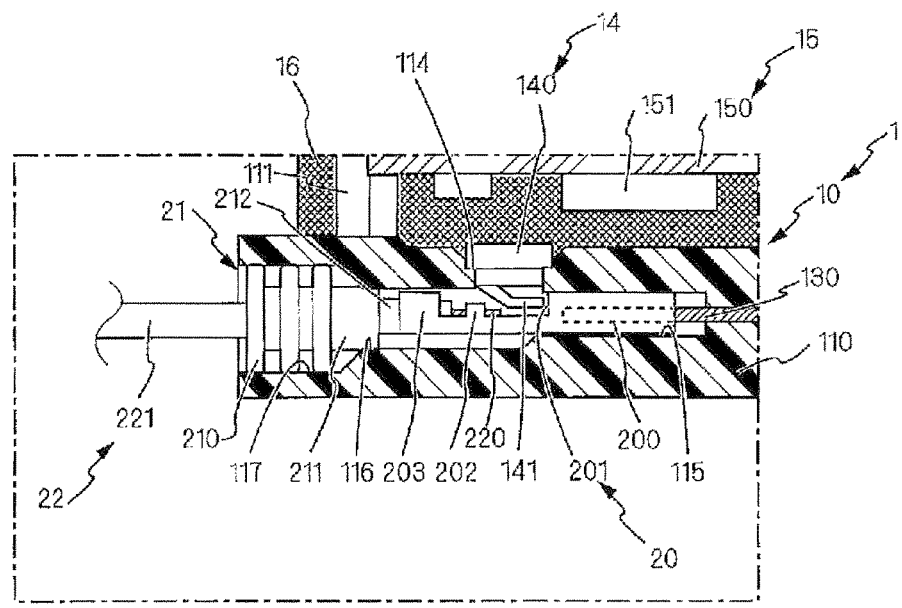
FIG. 3B is an enlarged major sectional view which represents beneficial effects of the invention.
Figure 4:
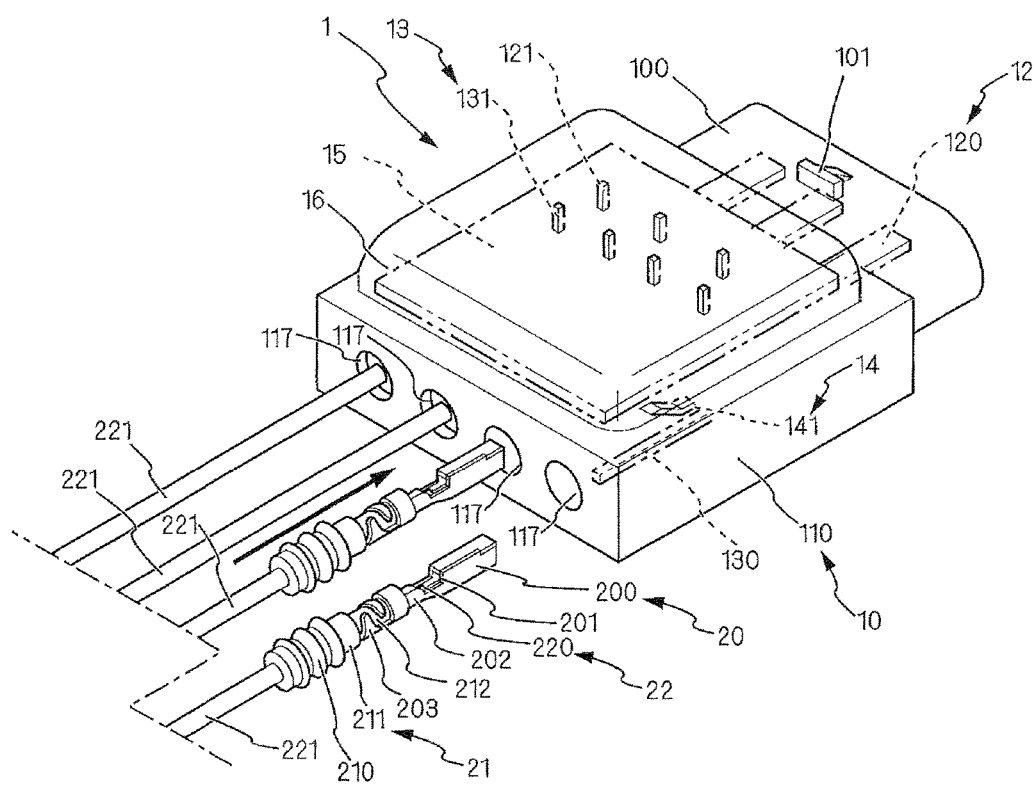
FIG. 4 is a perspective view which shows highlights of a sensor using a circuit module of the invention.
Figure 4:
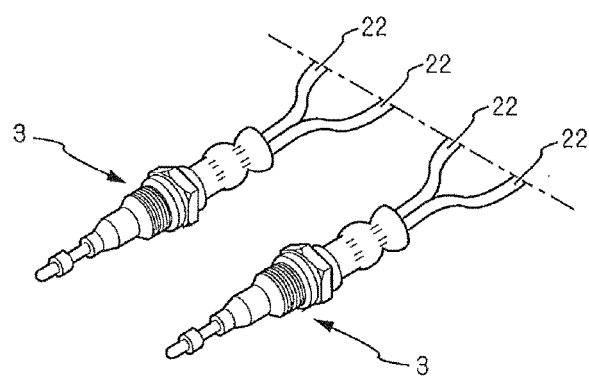

When the terminal member 20 is inserted from the insertion hole 117, it will cause, as illustrated in FIGS. 3A and 3B, the elastic seal rings 210 of the seal 21 of the terminal member 20 to be elastically placed in close contact with the insertion hole 117. The tip of the conductor holder 211 is press-fitted into the seal fitting portion 116, thereby enhancing the sealing ability. Within the space 115, the fitting portion 130 that is a male is put into the fitting portion 200 that is a female, thereby establishing electric conduction therebetween.

In this embodiment, the locking portion 141 is made from elastic material, so that it will flex and deform when subjected to pressure exerted by the fitting portion 200 when the terminal member 20 is fitted, thereby not obstructing the movement of the fitting portion 200 within the space 115, but when the fitting portion 200 reaches a given location in the space 200, it will cause the tongue 20 to be returned back to the original shape, so that the tip surface thereof contacts the locked portion 201 to lock the terminal member 20.

In the above way, the joining of the controlled objects 3 to the circuit module 1 is achieved easily.

Figure 5A:
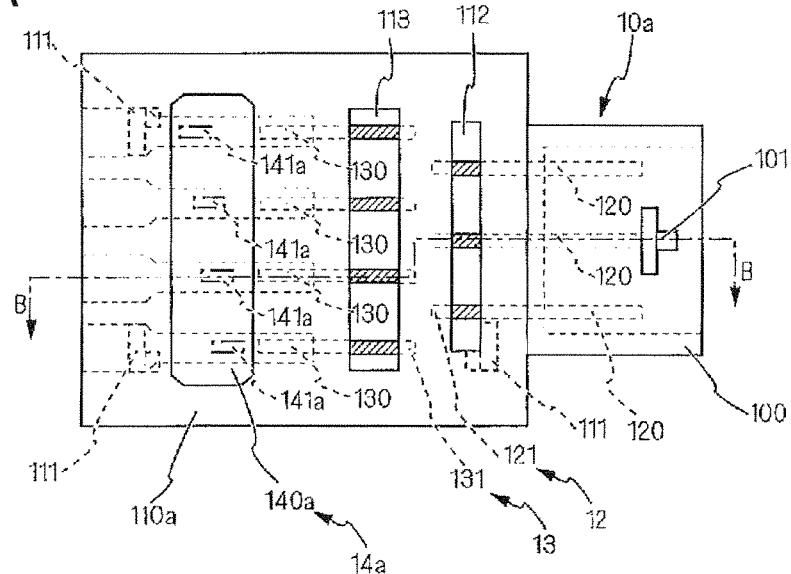
FIG. 5A is a plane view which shows highlights of a circuit fixing member in the second embodiment of the invention.

The circuit fixing member 10a and the circuit module 1a in the second embodiment of the invention will be described below with reference to FIGS. 5A, 5B, and 5C.

In the following embodiments, the same reference numbers as in the above embodiment will refer to the same parts, and explanation thereof in detail will be omitted here. Characteristic components will be denoted by using lower-case letter suffixes. The characteristic components in each embodiment will be described below.

The fixing member 10a of the second embodiment is different in that the locking member 14a is disposed on the surface of the embedded portion 110a where the supports 111a are not formed.

The locking member 14a of this embodiment includes an opening end cover 140a and terminal locking mechanisms 141a. The opening end cover 140a closes an open end of the terminal locking opening 114a formed in the back surface of the embedded portion 110a. The terminal locking mechanisms 141a extend from the opening end cover 140a and contact the locked portions 201 of the terminal members 20.

This embodiment offers the same beneficial effects as those in the above embodiment.

Figure 5B:
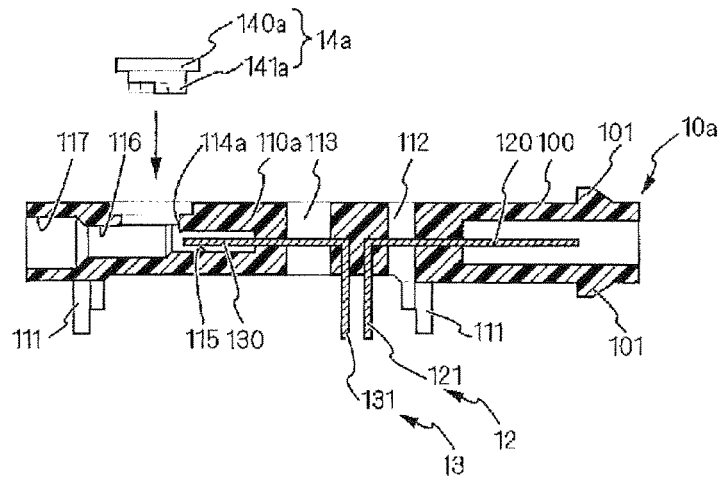
FIG. 5B is a sectional view along B-B in FIG. 5A.
Figure 5C:
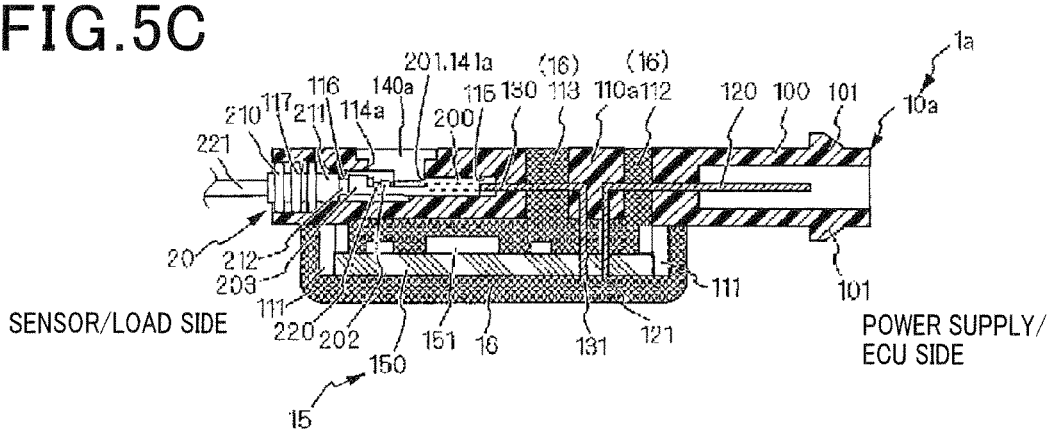
FIG. 5C is a sectional view which illustrates highlights of a circuit module in the second embodiment of the invention.

Additionally, in the previous embodiment, the tongues 141 are shaped to be elastically deformable on the grounds that the locking member 14 is sealed in advance within the circuit module 1, however, this embodiment permits the locking member 14a to be installed from outside the fixing portion 10a after the terminal member 20 are inserted into the fixing portion 10a, thus allowing the locking member 14a to be formed in the same configuration as in the first embodiment or to have elastically undeformable protrusions 141a, as illustrated in FIG. 5B.

It is also possible to combine this embodiment with the following embodiments.

In this embodiment, the locations of the terminal locking mechanisms 141a are changed, as can be seen in FIG. 5A, for the respective terminals to suite locations where the locking members 14a contacts the locked portions 201 of the terminal members 20 to the respective controlled objects 3 to be joined. This eliminates a mistake in choosing the insertion positions in the case where there are a plurality of terminal portions.

The structure where the locking positions or the size of the locking portions are changed for the respective terminals may be used with all the embodiments.

Further, this embodiment enables the locking member 14a to be installed after the control circuit 15 is covered with the sealing member 16. The highly accurate control circuit module 1a is, therefore, realized by temporarily connecting the control objects 3 with the control circuit 15 before the circuit 15 is covered with the sealing member 16, performing the sensitivity adjustment, disconnecting the controlled objects 3 from the control circuit 15 to form the sealing member 16, joining the controlled objects 3 to the control circuit 15 again, and then securing the terminal members 20 using the locking member 14a.

The circuit fixing member 10b and the circuit module 1b in the third embodiment of the invention will be described below with reference to FIGS. 6A, 6B, and 6C.

The locking member 14b of the fixing member 10b includes an opening end cover 140b which closes an open end of the terminal locking opening 114b. The terminal members 20b are equipped with the terminal locked portions 201b which extend in the shape of a tongue to make a contact with an edge of the terminal locking opening 114b.

The previous embodiment refers to the example where the terminal locked portions 201 of the terminal members 20 are locked by the terminal locking mechanisms 141 or 141a of the resinous locking member 140 or 140a mounted in the circuit module 1 or 1a, however, this embodiment has the terminal locked portions 201b which are formed on the sensor-side terminal members 20b and extend in the shape of a tongue. The terminal locked portions 201b are to engage an edge of the terminal locking opening 114b.

This embodiment offers the same beneficial effects as those in the above embodiments.

Figure 6A:
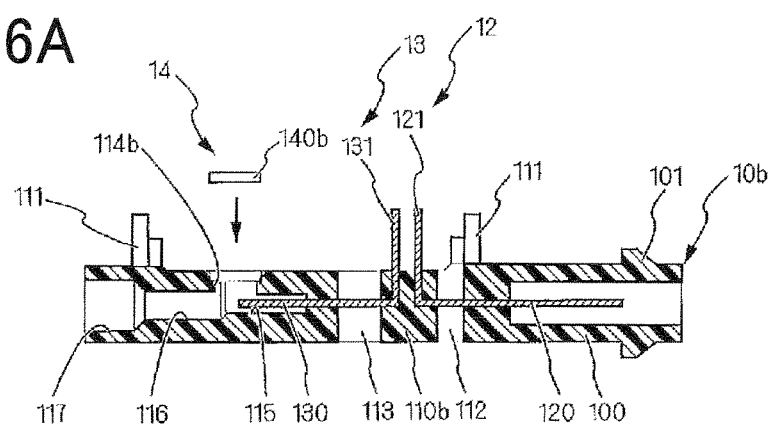
FIG. 6A is a sectional view which illustrates highlights of a circuit module 10b in the third embodiment of the invention.

The locking member 140b of this embodiment, as illustrated in FIG. 6A, does not have locking mechanisms and is formed in a simple shape which only closes a boundary between the opening 110b and the sealing member 16.

Figure 6B:
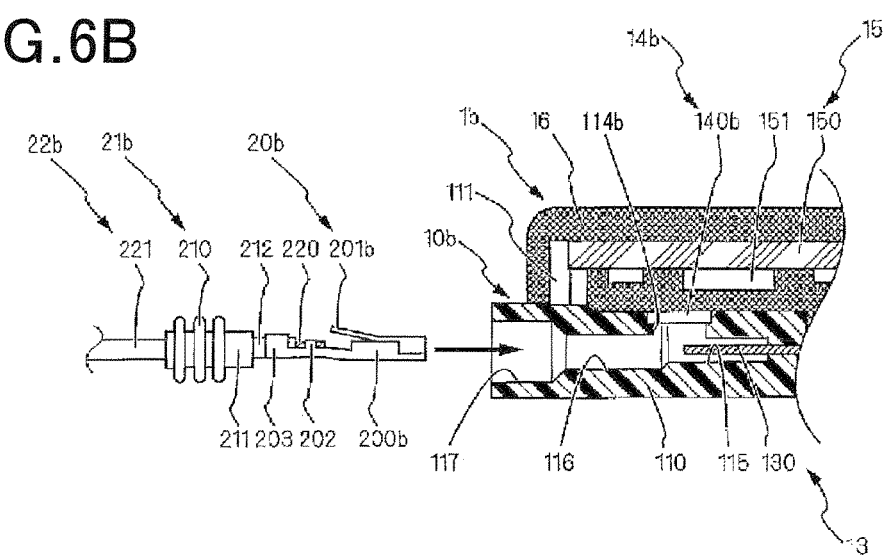
FIG. 6B is a sectional view which illustrates how to join a circuit module 1b of the third embodiment with a wiring terminal connected to a sensor in the first embodiment.

When the sealing member 16 is formed, as illustrated in FIG. 6B, the sensor-side terminal locking member 140b is fixed. The opening 114b forms a step on a portion of an inner peripheral surface of the space 115.

When the terminal member 20b is inserted through the terminal insertion hole 117, it will cause the terminal locked portion 201b formed in the shape of a tongue to be elastically bent, so that it passes through the seal end fitting hole 116 and then is retuned back to its original shape when reaching the opening 114b.

Figure 6C:
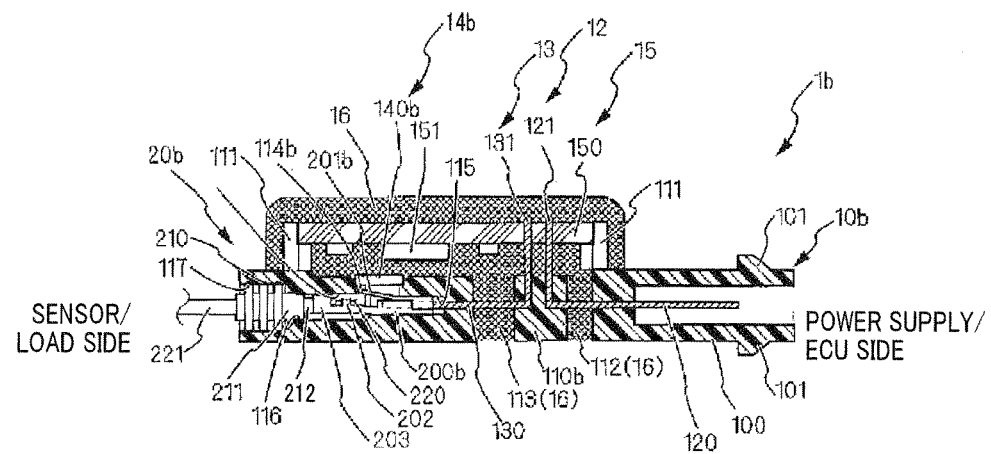
FIG. 6C is a sectional view which illustrates highlights of a circuit module 10b in the third embodiment of the invention.

This causes, as illustrated in FIG. 6C, the controlled object side fitting portion 200b and the fitting portion 130 to be joined together to achieve the electric conduction between the sensor 3 and the control circuit 15. The end surface of the terminal locked portion 201b is placed in contact with the terminal locking opening 114b.

Figure 7A:
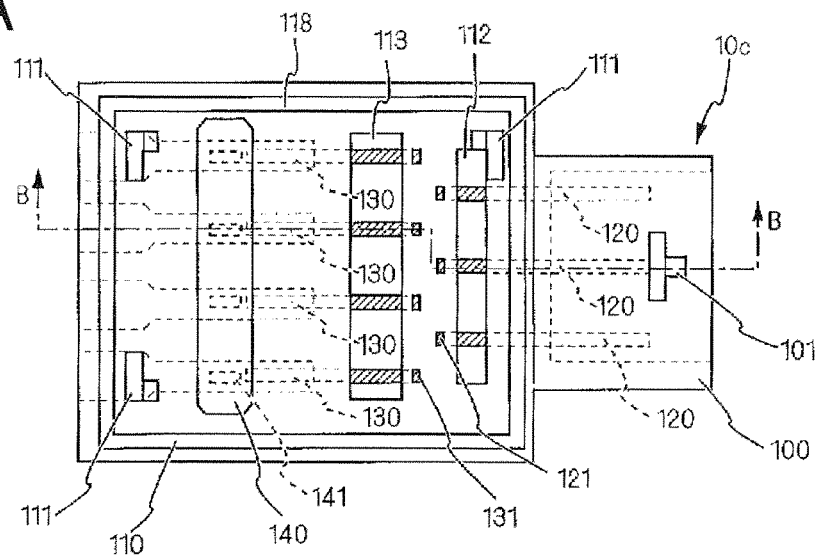
FIG. 7A is a sectional view which illustrates highlights of a circuit module 10c in the fourth embodiment of the invention.
Figure 7B:
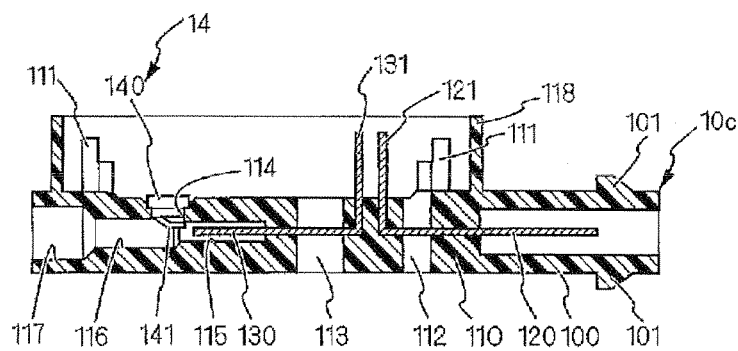
FIG. 7B is a sectional view along B-B in FIG. 7A.
Figure 7C:
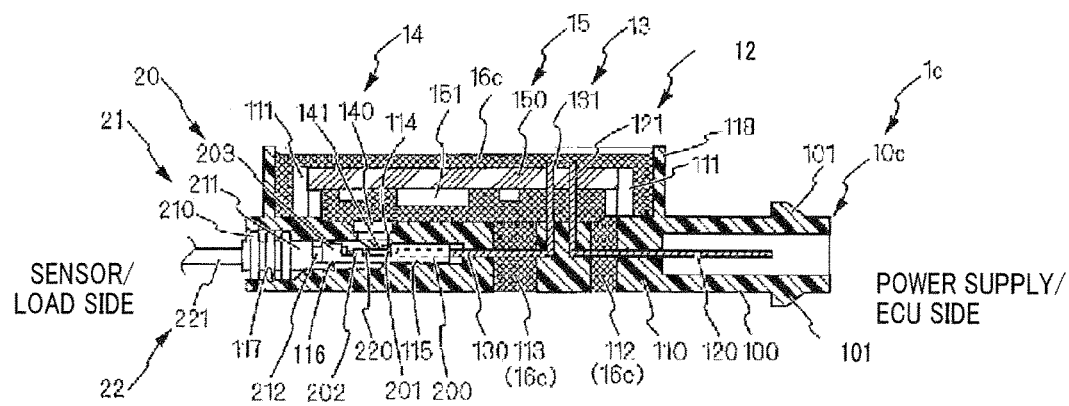
FIG. 7C is a sectional view which illustrates highlights of a circuit module 10c in the fourth embodiment of the invention.

The circuit fixing member 10c and the circuit module 1c in the fourth embodiment of the invention will be described below with reference to FIGS. 7A, 7B, and 7C.

The previous embodiment exemplifies the so-called molding by which the sealing member 16 is formed on the surface of the first mold 10, 10a, or 10b so as to cover the control circuit 15, however, the potting molding of this embodiment may be used which forms a peripheral wall 188 as the circuit fixing member 10c which stands so as to surround the periphery of the circuit board 150 and fills the inside of the peripheral wall 188 with resin to make the sealing member 16c.

The structure of this embodiment where the peripheral wall 188 is provided may be used with any of the above embodiments. This embodiment also offers the same beneficial effects as those in the above embodiments.

The joining of the sensor 3 and the control circuit 140 is achieved only by inserting the controlled object side terminal member 20 through the insertion hole 117 after the sealing member 16c is solidified. The junction terminal 130, as illustrated in FIG. 7C, engages the controlled object side terminal fitting portion 200. The terminal fitting portion 201 is locked by the terminal locking mechanism 141. The sealing rings 210 made of elastic material are placed in close contact with the inner peripheral surface of the sensor connecting terminal insertion hole 117, thereby blocking the entry of water from outside.

Additionally, the peripheral wall 118 of this embodiment also works instead of a cavity of a mold for use in forming the sealing member 16c. The formation of the sealing member 16c is, thus, made easily by avoiding the leakage of resin from the openings 113 and 112 through a lower mold half.

Figure 8A:
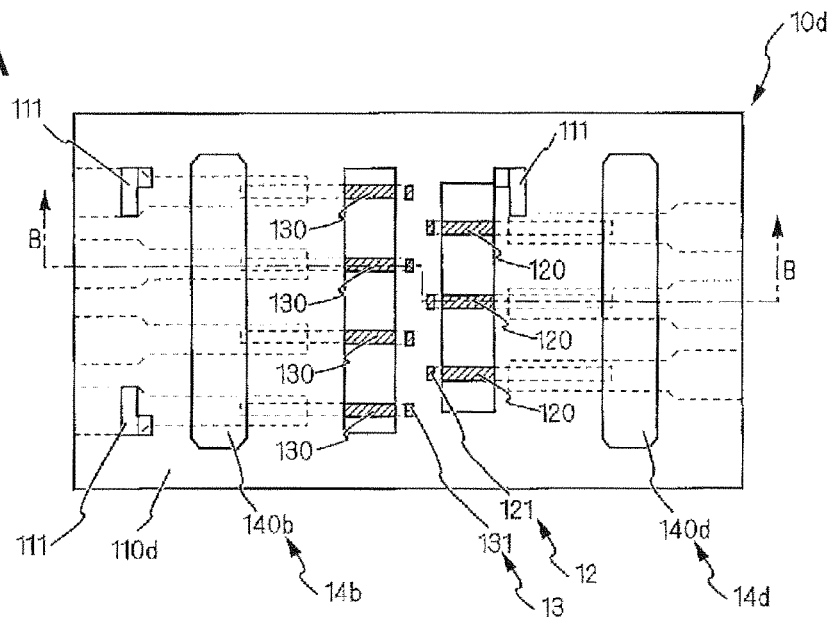
FIG. 8A is a sectional view which illustrates highlights of a circuit module 10d in the fifth embodiment of the invention.
Figure 8B:
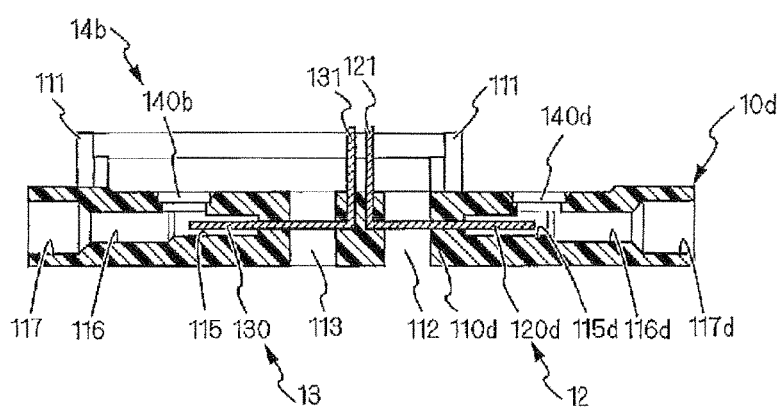
FIG. 8B is a sectional view along B-B in FIG. 8A.
Figure 8C:
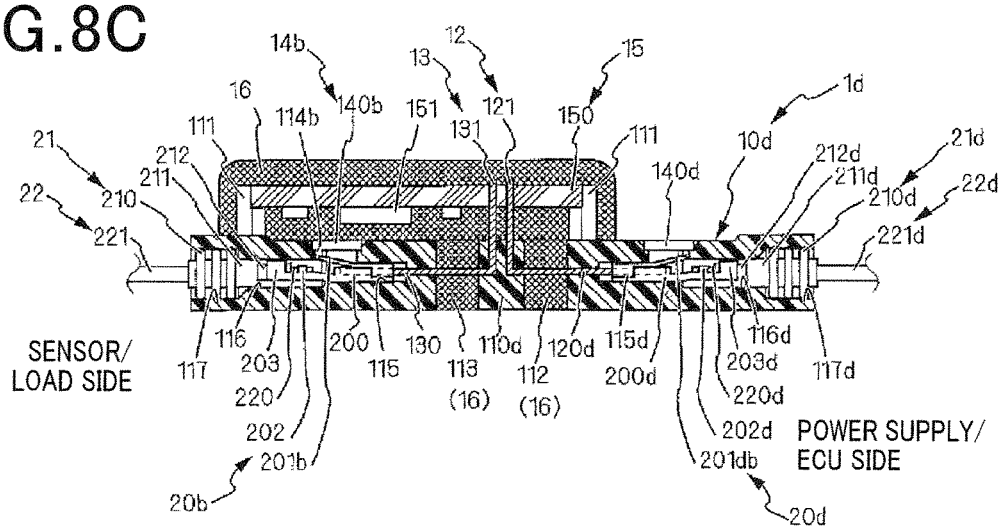
FIG. 8C is a sectional view which illustrates highlights of a circuit module 10d in the fifth embodiment of the invention.

The circuit fixing member 10d and the circuit module 1d in the fifth embodiment of the invention will be described below with reference to FIGS. 8A, 8B, and 8C.

The previous embodiments exemplify a typical connector structure in which the connector terminals 120 which connect with a power supply or a control device (ECU) are exposed inside the connector housing 100, and the claw 101 of the connector housing 100 engages a locking means formed on a mating connecting housing to achieve the connection of the connector terminals 120. This embodiment is different from the above embodiment in that the fitting portions 120d for use in connecting with the power supply are also exposed to the spaces 115d so that they may be coupled within the spaces 115d to the terminal members 20d which have already been joined to the power supply.

The drawing illustrates an example in which the same structures as in the third embodiment are used as the locking member 14d and the locked portion 201d, but the structures of any other embodiments may also be employed.

The above structure is simple which also achieves a connection with the power supply or the ECU without a connector housing.

The invention is not limited to the previous embodiments and may be modified as long as within the terminal connecting spaces 115 formed in the terminal-embedded portion 110, 110a, 110b, 110c, or 110 of the circuit fixing member 10, 10a, 10b, 10c, or 10d, the terminal members 13 and the water-resistant terminals 20, 20b, or 20d are engaged together to develop fixing means in the ends of the conductors 22, thereby eliminating the need for joining the conductors 22 to the circuit module 1, 1a, 1b, or 1c in advance, and the circuit module 1, 1a, 1b, or 1c may be joined to the conductors 22 through a one-touch operation after the sealing member 16 is formed.

For example, the previous embodiments refer to the example where the control circuit 15 is provided in the form of a single layer, but the circuit supports 111 may be shaped to have stepwise shoulders to retain a plurality of control circuits 15, or the terminal-embedded portion 110 may alternatively have the control circuits 15 mounted on opposed surfaces thereof.

In the case where the control circuits 15 are mounted on the opposed surfaces of the terminal-embedded portion 110, the locking members 14, 14b, 14c, or 14d shown in the first, third, fourth, or fifth embodiment are used.

Figure 9A:
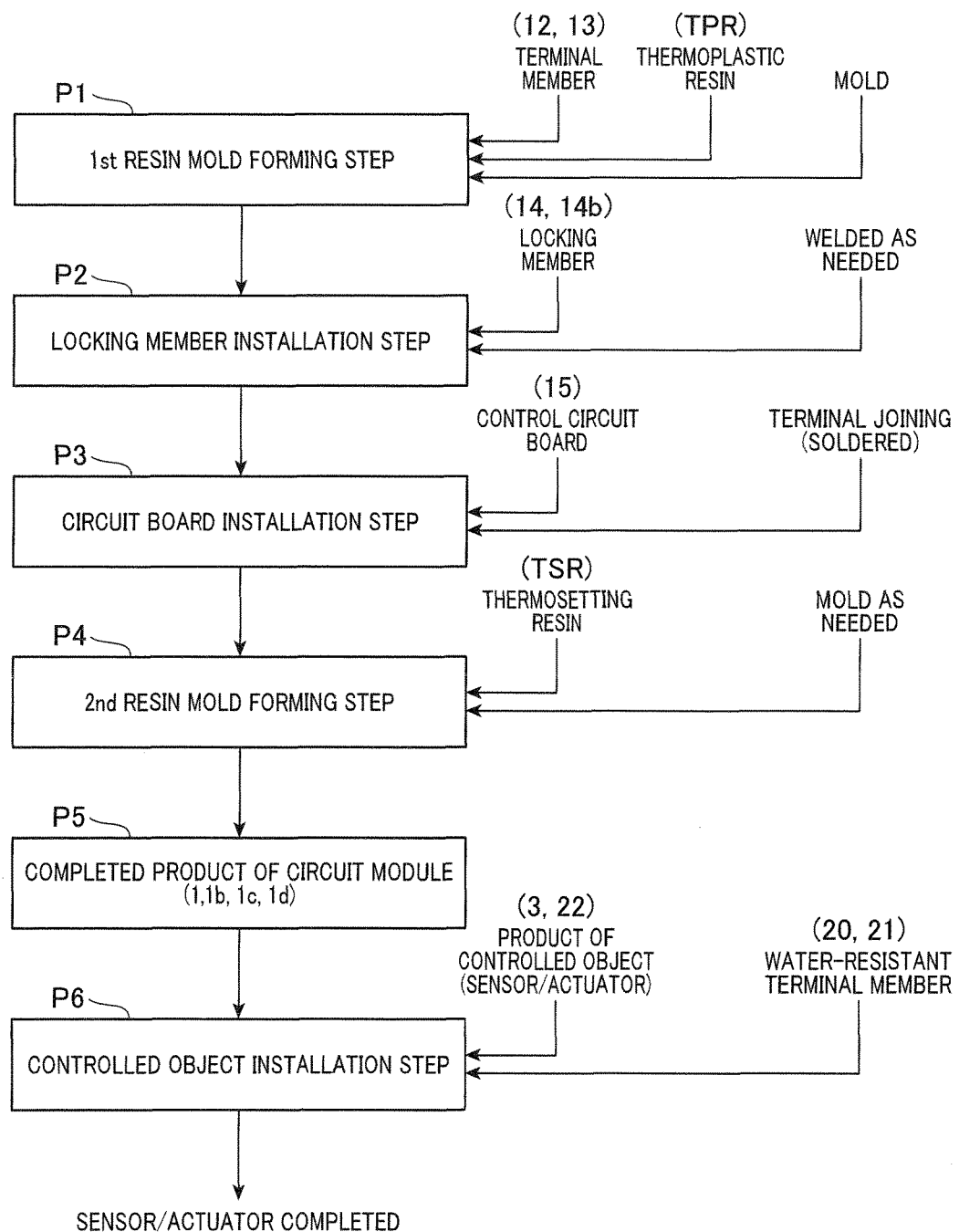
FIG. 9A is a flowchart which represents a manufacturing method of a sensor or an actuator using a circuit module in the first, the third, the fourth, or the fifth embodiment of the invention.

The production method of the circuit module 1, 1b, 1c, or 1d using the fixing member 10, 10b, 10c, or 10d in the first, third, fourth, or fifth embodiment and how to connect the controlled object 3 thereto will be described below with reference to FIG. 9A.

The present invention is the method of joining the circuit module 1, 1b, 1c, or 1d and the controlled object 3 together. The circuit module 1, 1b, 1c, or 1d has at least built in the terminal member 13 which achieves a connection between the controlled object 3, as provided externally, and the control circuit 15 working to control the controlled object 3. The circuit module 1, 1b, 1c, and 1d includes at least the control circuit 15 and the circuit fixing member 10, 10b, 10c, or 10d for securing the control circuit 15 and is designed to air-tightly seal the control circuit 15 through the sealing member 16 in the form of a unit. The circuit module 1, 1b, 1c, and 1d is equipped with any of the circuit fixing members 10, 10b, 10c, and 10d. The controlled object side terminal member 20, 20b, or 20d is equipped with the controlled object side terminal fitting portion 200 to be fitted on the terminal fitting portion 130, the terminal locked portion 201, 201b, or 201d, and the water-resistant seal 21 which is to be elastically placed in close contact with the terminal insertion hole 117. The control circuit 15 is disposed on the circuit fixing member 10, 10b, 10c, or 10d and then connected with the terminal member 13. The control circuit 15 is hermetically covered with the sealing member to complete the circuit module 1, 1b, 1c, or 1d. Afterwards, the controlled object side terminal member 20, 20b, or 20d is inserted into the terminal insertion hole 117 to make a connection between the terminal fitting portion 130 and the controlled object side fitting portion 200.

In this embodiment, the circuit member forming step P1 produces, by means of the so-called insert molding, the circuit fixing member 10, 10b, 10c, or 10d which at least has built in the terminal member 13 which achieves the connection between the controlled object 3, as provided externally, and the control circuit 15 working to control the controlled object 3, and which firmly retains the control circuit 15.

Next, the locking member installation step P2 installs the locking member 14 which has already been made from resin on the fixing member 10, 10b, 10c, or 10d.

If needed, the locking member 14, 14b, or 14d is fused to the fixing member 10, 10b, 10c, or 10d. In this embodiment, such fusion may be omitted since the locking member 14, 14b, or 14d is covered with the sealing member 16 in the following step.

Subsequently, the control circuit installation step P3 installs the circuit 15 which has already been made on the supports 111 of the circuit fixing portion 10, 10b, 10c, or 10d.

Subsequently, the seal forming step P3A hermetically seals the circuit 15 with the sealing member 16.

In the structure of the fixing member 10, 10b, or 10d in the first, third, or fifth embodiment, the sealing member 16 is formed by means of a mold. In the fixing member 10c of the fourth embodiment, the so-called potting may be achieved without use of the mold to put the thermosetting resin TSR inside the peripheral wall 18 of the fixing member 10 for sealing the circuit 15.

The circuit module 1, 1b, or 1d is completed in the above steps.

Next, the controlled object joining step P6 attaches the water-proof terminal member 20 with the water-resistant seal 20 or 21 to the end of the conductor 22 extending from the controlled object 3 which has been already prepared. The water-resistant terminal member 20 is then put into the insertion hole 171 of the circuit module 1, 1b, 1c, or 1d. The fitting portion 200 is joined to the fitting portion 130 within the space 115, thereby completing a connection between the circuit module 1 and the controlled object 3.

In this embodiment, once the terminal member 20 or 20b is installed on the fixing member 110 and secured by the locking member 14, 14b, or 14d, it is impossible to remove the terminal member 20 or 20b easily. It is easy to complete the connection between the controlled object 3 and the circuit module 1, thereby completing a sensor or an actuator using the circuit fixing member 10, 10b, 10c, or 10d.

Figure 9B:
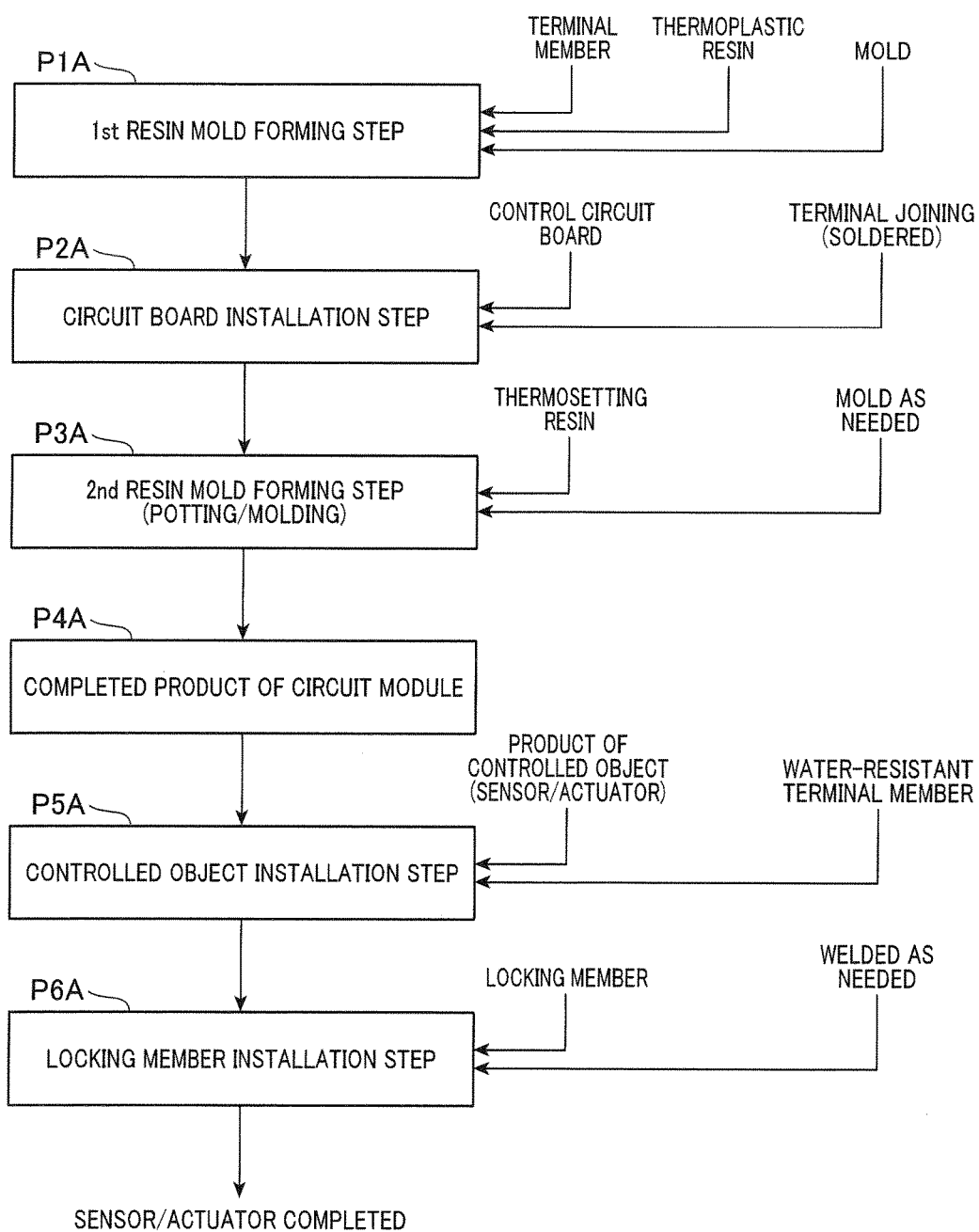
FIG. 9B is a flowchart which represents a manufacturing method of a sensor or an actuator using a circuit module in the second embodiment of the invention.

The production method of the circuit module 1a using the fixing member 10a in the second embodiment and how to connect the circuit module 1a with the controlled object 3 will be described below with reference to FIG. 9B.

In this embodiment, the circuit member forming step P1A produces, by means of the so-called insert molding, the circuit fixing member 1a which at least has built in the terminal member 13 which achieves the connection between the controlled object 3, as provided externally, and the control circuit 15 working to control the controlled object 3, and which firmly retains the control circuit 15.

Next, the control circuit installation step P2A installs the circuit 15 which has already been made on the fixing portion 10a.

Subsequently, the seal forming step P3A air-tightly seals the circuit 15 with the sealing member 16 integrally.

The above step may use a known sealing way, such as the potting or molding techniques like in the above embodiment.

In this embodiment, the circuit module 1a is completed, as can be seen in the step P4A, without installing the locking member 14a on the circuit fixing member 10a.

Subsequently, the controlled object joining step 5A inserts the terminal member 20 into the terminal insertion hole 117a to connect the fitting portion 130 and the controlled object side terminal fitting portion 200 within the space 115. Afterwards, the locking member 14a is installed to secure the controlled object side fitting portion 200 in the space 115.

The locking member 14a is fused to the terminal-embedded portion 110a.

In this embodiment, the locking member 14a is installed on the circuit module 1a from outside it, thus permitting the terminal member 20 from being installed or removed. After the controlled object 3 is coupled to the circuit module 1a, the locking member 14a may be fused to the circuit fixing member 10a to hold the terminal member 20 from being removed easily from the circuit module 1a.

In this embodiment, after the control module 1a is joined temporarily to the controlled object 3 in the course of the production, and the circuit 15 is subjected to fine adjustment, the circuit module 1a may be disconnected from the controlled object 3, covered with the sealing member 16, and then joined again to the controlled object 3.

REFERENCE SIGNS LIST 1 circuit module
10, 10a, 10b, 10c circuit fixing member
110 terminal-embedded portion
111 circuit support
113 terminal locking opening
114, 114a, 114b, 114d terminal locking opening
115 terminal conducting space
116 seal fitting hole
117 sensor connector terminal insertion hole
13 terminal member
130 terminal fitting portion (male side)
131 terminal circuit side connecting portion
14, 14a, 14b, 14d terminal locking means
140, 140a, 140b, 140d opening end cover
141 141a terminal locking mechanism
15 control circuit
150 circuit board
151 circuit component
16 sealing member
20 waterproof terminal (controlled object side terminal member)
200 terminal fitting portion (female side)
201, 201a, 201b terminal locked portion
202 conductor gripper
203 seal gripper
21 water-resistant terminal sealing portion
210 seal ring
211 conductor holder
22 conductor
220 conductive wire
221 insulating film
3 controlled object (sensor or load)

The invention claimed is:

1. A circuit fixing member which has built in a terminal member which achieves a connection between a control circuit which works to control a controlled object, as provided externally, and the controlled object, and which secures the control circuit, comprising:
a terminal-embedded portion in which at least the terminal member is embedded, the terminal-embedded portion being equipped with a plurality of circuit supports which protrude from one or both surfaces of the terminal-embedded portion and a terminal conducting space which communicates at one end thereof with a terminal insertion hole opening to a side surface of the terminal-embedded portion and is closed at the other end thereof,
wherein said terminal member is equipped with a terminal fitting portion for connecting with said controlled object and a circuit side connecting portion for connecting with said control circuit,
wherein for engaging a controlled object side terminal member which has already been joined to the controlled object with said terminal fitting portion within said terminal conducting space, a terminal locking opening is provided which establishes communication between either or both upper and lower surfaces of said terminal-embedded portion and said terminal conducting space, and a terminal locking member is provided which locks said controlled object side terminal member inside said terminal conducting space through the terminal locking opening,
wherein said terminal locking member includes an opening end cover which closes an end of said terminal locking opening,
wherein said controlled object side terminal member includes a terminal locked portion which extends in the form of a tongue to make contact with an edge of said terminal locking opening, and
wherein said control circuit connects with a plurality of the controlled objects, and wherein locations where said terminal locking member contacts with said controlled object side terminal members are changed for the respective controlled objects.

2. A circuit fixing member as set forth in claim 1, wherein said terminal locking member includes an elastically deformable terminal locking mechanism which extends from the opening end cover in the form of a tongue and is placed in contact with a terminal locked portion of said controlled object side terminal member.

3. A circuit fixing member as set forth in claim 1, wherein said terminal locking member includes a terminal locking mechanism, the opening end cover closing an end of said terminal locking opening formed in the surface of said terminal-embedded portion on which said circuit supports are not provided, the terminal locking mechanism extending from the opening end cover to make contact with a terminal locking portion of the controlled object side terminal member.

4. A circuit module comprising a circuit fixing member and a control circuit, the circuit fixing member having built in at least a terminal member which achieves a connection between the control circuit working to control a controlled object, as provided externally, and the controlled object and which secures said control circuit,
wherein said control circuit is hermetically sealed with a sealing member integrally, and
wherein said circuit fixing member is the circuit fixing member, as set forth in claim 1.

5. A method of joining a circuit module and a controlled object, the circuit module including a circuit fixing member and a control circuit, the circuit fixing member having built in at least a terminal member which achieves a connection between the control circuit working to control the controlled object, as provided externally, and the controlled object and which secures said control circuit, the circuit module air-tightly sealing the control circuit with a sealing member integrally, wherein said circuit module includes the circuit fixing member, as set forth in claim 1, wherein said controlled object side terminal member includes a controlled object side fitting portion, said terminal locked portion, and a water-resistant seal, the controlled object side fitting portion being fitted to said terminal fitting portion, the water-resistant seal being to be placed elastically in close contact with said terminal insertion hole, and wherein after said control circuit is mounted on said circuit fixing member, coupled with said terminal member, and the control circuit is air-tightly covered with the sealing member to complete said circuit module, said controlled object side terminal member is inserted into said terminal insertion hole to make a connection between said terminal fitting portion and said controlled object side fitting portion.

6. A method of joining a circuit module and a controlled object, the circuit module including a circuit fixing member and a control circuit, the circuit fixing member having built in at least a terminal member which achieves a connection between the control circuit working to control the controlled object, as provided externally, and the controlled object and which secures said control circuit, the circuit module air-tightly sealing the control circuit with a sealing member integrally, wherein said circuit module includes the circuit fixing member, as set forth in claim 3, wherein said controlled object side terminal member includes a controlled object side fitting portion, said terminal locked portion, and a water-resistant seal, the controlled object side fitting portion being fitted to said terminal fitting portion, the water-resistant seal being to be placed elastically in close contact with said terminal insertion hole, and wherein after said control circuit is mounted on said circuit fixing member, coupled with said terminal member, and the control circuit is air-tightly covered with the sealing member to complete said circuit module without installing said locking member on said circuit fixing member, said connected object side terminal member is inserted into said terminal insertion hole to make a connection between said terminal fitting portion and said controlled object side fitting portion, after which said locking member is installed to lock said controlled object side terminal fitting portion.

\* \* \* \* \*